United States Patent
Svoiski

(10) Patent No.: US 8,896,356 B1
(45) Date of Patent: Nov. 25, 2014

(54) RAMP CONTROL WITH PROGRAMMABLE PARAMETERS

(71) Applicant: NXP B.V., Eindhoven (NL)

(72) Inventor: Mikhail Svoiski, Tempe, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/060,344

(22) Filed: Oct. 22, 2013

(51) Int. Cl.
H03K 4/06 (2006.01)
H03K 4/00 (2006.01)

(52) U.S. Cl.
CPC .......................................... *H03K 4/00* (2013.01)
USPC ............ 327/140; 327/131; 327/135; 327/136

(58) Field of Classification Search
USPC .......................................................... 327/140
See application file for complete search history.

(56) References Cited

U.S. PATENT DOCUMENTS

| | | | |
|---|---|---|---|
| 6,658,577 B2 | 12/2003 | Huppi et al. | |
| 7,091,795 B1 * | 8/2006 | Tsyrganovich | ............... 331/1 R |
| 2003/0067473 A1 * | 4/2003 | Taylor et al. | ................... 345/561 |

OTHER PUBLICATIONS

"16-channel FM+I2C-bus 57 mA/20 V Constant Current LED Driver" NXP Semiconductors Objective Data Sheet, PCA9955A, Rev. 1.6, (Apr. 16, 2013), 58 pages.
"RGB LED Controller Driver with PWM Control" New Japan Radio Co., Ltd, NJU6063, Ver. Jul. 31, 2012, 30 pages.

* cited by examiner

Primary Examiner — Lincoln Donovan
Assistant Examiner — Patrick Chen

(57) ABSTRACT

A ramp output control device includes a driver configured to receive at least two inputs from a microcontroller. The driver includes a time duration register configured to store a current clock count until a preset time duration is reached. The driver also includes a ramp output register configured to store a current output value at an output of the device. The driver also includes a calculation block configured to determine whether to increase the current output value at the output based on the at least two inputs.

17 Claims, 5 Drawing Sheets

RAMP CONTROL WITH PROGRAMMABLE PARAMETERS

Many applications use linear or gradual changes of some parameter over time. For example, light emitting diode (LED) current controls or motor controls often use linear or nearly linear ramps for gradually changing an output to a load. Such a ramp output is made up of a series of steps, or changes in voltage value, from an initial value to an end value. The end value may be higher or lower than the initial value. Because the ramp is a series of steps, the ramp may be defined/determined using various parameters, including the final value of the ramp output, the total ramp duration, the step size, and the step duration.

Embodiments of a device, a system, and a method are disclosed. In one embodiment, the device is a ramp output control device. The device includes a driver configured to receive at least two inputs from a microcontroller. The driver includes a time duration register configured to store a current clock count until a preset time duration is reached. The driver also includes a ramp output register configured to store a current output value at an output of the device. The driver also includes a calculation block configured to determine whether to increase the current output value at the output based on the at least two inputs.

In one embodiment, the system includes a controller configured to output at least two values. The system also includes a ramp driver. The ramp driver includes a time duration register configured to store a clock count for a preset time duration. The preset time duration is determined by a first value from the controller. The ramp driver also includes a ramp output register configured to store an output value at an output of the device. The ramp driver also includes a calculation block configured to determine whether to increase the output value at the output based on the first value and a second value from the controller.

In one embodiment, the method is a method for controlling a ramp output. The method includes receiving at least two values from a controller. Each of the at least two values describes a separate characteristic of the ramp output. The method also includes storing a clock count for a preset time duration. The preset time duration is determined by a first value from the controller. The method also includes storing a current output value at a ramp output register. The method also includes determining whether to increase the current output value from a ramp step calculation algorithm based on the first value and a second value from the controller.

Other aspects in accordance with the invention will become apparent from the following detailed description, taken in conjunction with the accompanying drawings, illustrated by way of example of the principles of the invention.

Throughout the description, similar reference numbers may be used to identify similar elements.

Figure 1:
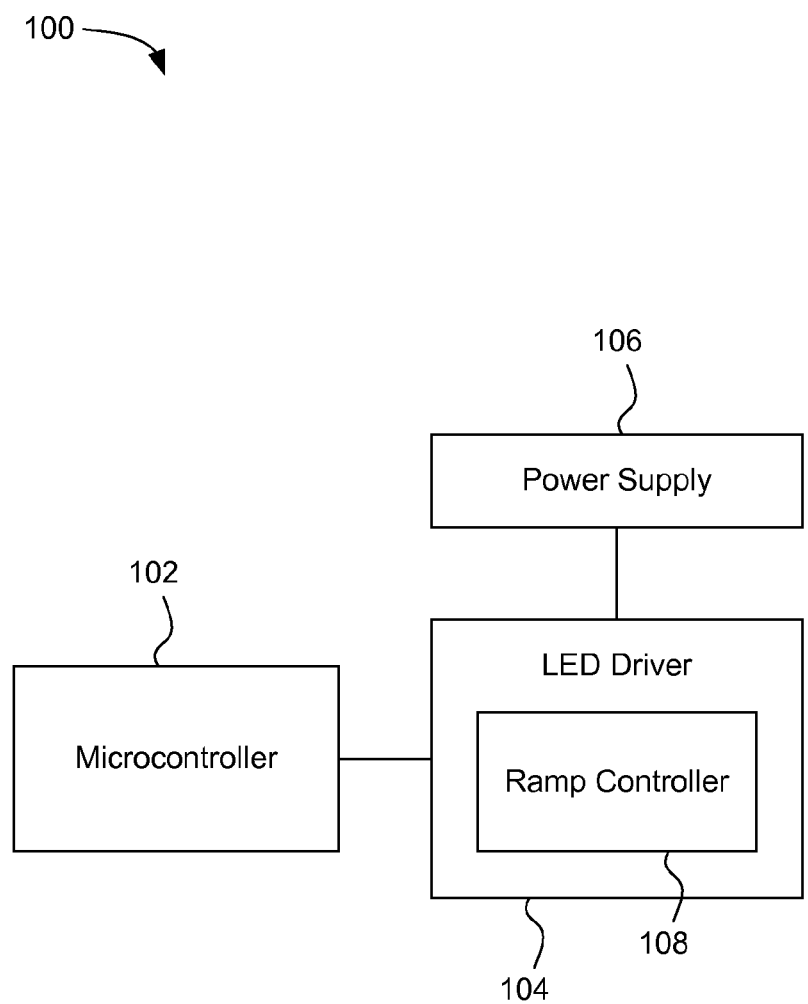
FIG. 1 depicts a block diagram of one embodiment of a ramp output control system.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

While many embodiments are described herein, at least some of the described embodiments present a device and method for controlling a ramp output. Specifically, the ramp control is implemented at a driver that receives at least two input parameters that describe the ramp from a microcontroller or other controller. In one embodiment, the driver receives only two parameters: the total ramp duration and the final output value. The duration of a single step with multiple successive addition and subtraction operations are performed in hardware at the driver as the ramp progresses. In other embodiments, the driver receives 3 or more parameters from the microcontroller and performs the ramp calculations to determine the ramp output.

Conventional ramp control systems calculate information about the size and/or duration of the steps at the system microcontroller, and the resulting parameters are supplied to the hardware ramp controller. The step size/duration is calculated at the microcontroller and then provided to the driver, which uses three or more parameters from the microcontroller to generate the ramp.

Because the step size/duration calculations are not performed on the driver, customers providing the microcontrollers are often required to perform the hardware division calculations at the microcontroller. By providing a driver that generates the ramp by performing calculations typically performed on the microcontroller, the implementation on the customer side is simplified. The customer may only be required to input two or more input parameters into the microcontroller, and the driver interfacing with the microcontroller is able to use the input parameters to determine the ramp output. Additionally, implementing a calculation block on the driver side that requires as few as two input parameters from the microcontroller reduces both the hardware complexity and the hardware real estate.

FIG. 1 depicts a block diagram of one embodiment of a ramp output control system 100. While the ramp output control system 100 is described as having the components shown in FIG. 1, the ramp output control system 100 may have additional or different components than those shown in FIG. 1. For example, while the ramp output control system 100 is described in conjunction with an LED driver 104, the ramp output control system 100 may be used in conjunction with any type of driver compatible with a ramp output, such as a motor control.

In one embodiment, the ramp output control system 100 includes a microcontroller 102, an LED driver 104, and a power supply 106. The power supply 106 may provide the power necessary for operating the LED driver 104 and/or the microcontroller 102. The LED driver 104 may be any type of LED driver 104 that drives any number of LEDs and according to any type of pattern or program. For example, the LED driver 104 may output signals to a plurality of LEDs that are each programmed together or individually. Additionally, the outputs to each of the LEDs may be changed according to the input to the LED river 104.

The LED driver 104 includes a ramp controller 108 for processing inputs from the microcontroller 102. The ramp controller 108 may include hardware for performing various calculations on the input parameters from the microcontroller 102 to generate the desired ramp output to each of the LEDs. For example, the ramp output to each of the LEDs may be a linear ramp that turns the selected LED on or off according to the linear ramp output. In other embodiments, the ramp may be another type of gradual change in the voltage value to a specific LED.

The microcontroller 102 may be any type of controller that provides input to the LED driver 104. In one embodiment, the microcontroller 102 is a programmable device implemented at a customer side. The LED driver 104 may be manufactured by a manufacturer with the calculation hardware included in the LED driver 104, such that when the customer programs the microcontroller 102, the customer is only required to program the microcontroller 102 to provide to the LED driver 104 the input parameters that allow the LED driver 104 to determine the correct ramp output for operating the LEDs. In other embodiments, the microcontroller 102 and LED driver 104 may be programmed/manufactured at the same location.

The input parameters provided by the microcontroller 102 determine how the LEDs operate. For example, the ramp may be a fast ramp, resulting in a fast LED transition from off to on, and vice versa. Alternatively, the ramp may be a slow ramp, resulting in a slow LED transition. In another example, the ramps for turning the LED off and on may be unequal. In another example, the ramps for each LED may be different, potentially resulting in different transition times for each LED.

Four parameters—time duration value, end level value, size of each step, and duration of each step—describe the ramp output from a hardware perspective, such that the LED driver 104 is able to generate the necessary ramp for operating the LEDs according to desired specifications. In one embodiment, the input parameters provided by the microcontroller 102 include a total ramp duration (or time duration value) and a final output value (or end level value) describing the ramp output. From a user perspective, these two parameters effectively describe the ramp output. From a hardware perspective, however, additional calculations are typically made to determine additional parameters describing the ramp output, including the step size and step duration of each step in the ramp. When the LED driver 104 receives the time duration value and end level value parameters, the ramp controller 108 performs the necessary calculations to generate the desired ramp. The calculations may include a plurality of addition and subtraction operations as the ramp progresses.

In another embodiment, the microcontroller 102 provides three or more parameters to the LED driver 104 (e.g. end level value, step size, and step duration). The ramp controller 108 may include a hardware divider to perform necessary calculations for determining the fourth parameter or other information for generating the ramp output. While a hardware divider may be used according to the principles described herein, the hardware divider may increase the hardware complexity and space taken on the LED driver 104.

Figure 2:
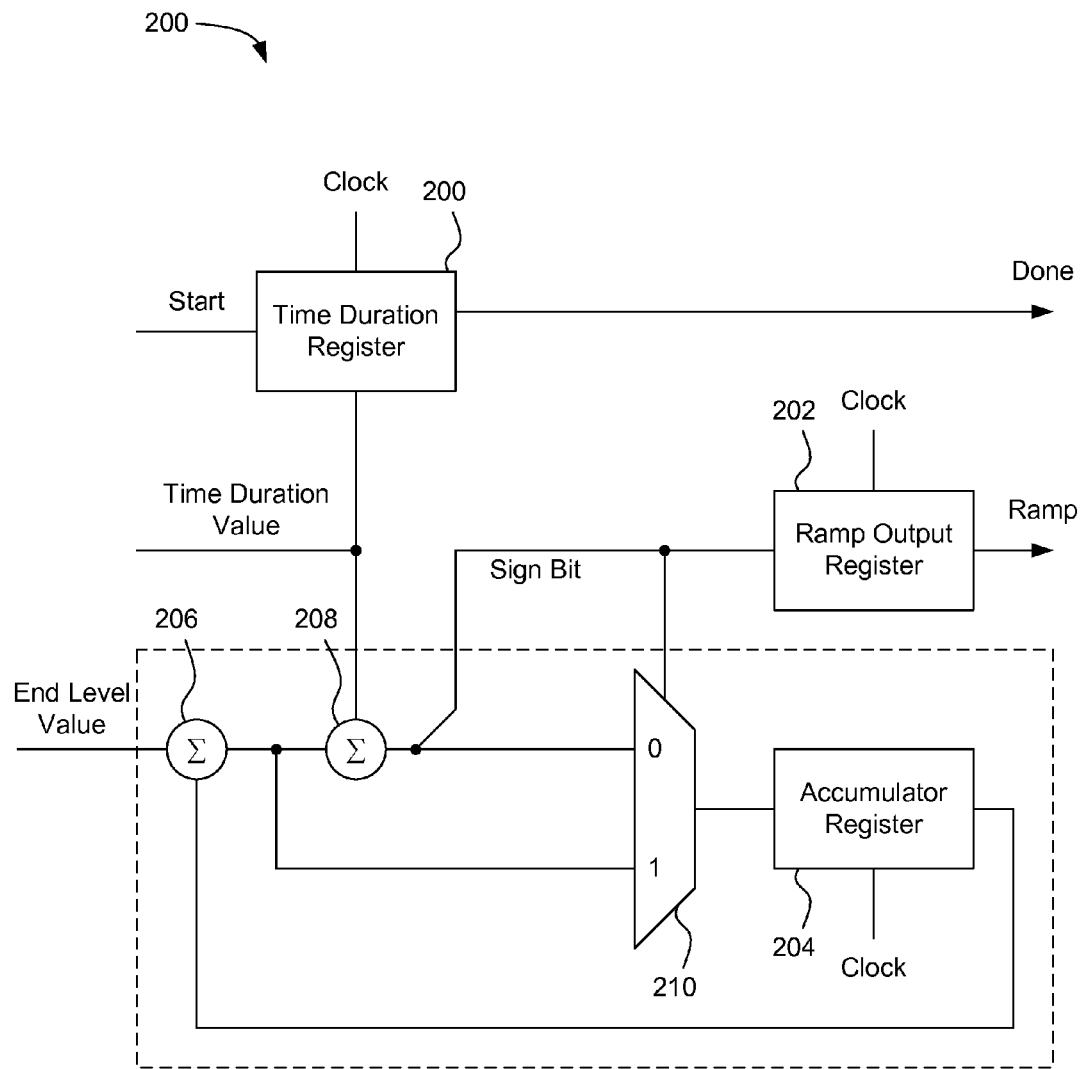
FIG. 2 depicts a schematic diagram of an embodiment of the ramp controller of FIG. 1.

FIG. 2 depicts a schematic diagram of an embodiment of the ramp controller 108 of FIG. 1. While the ramp controller 108 is depicted in conjunction with the ramp output control system 100 of FIG. 1, the ramp controller 108 may be used in conjunction with any ramp output control system 100.

In one embodiment, the ramp controller 108 includes three registers—a time duration register 200, a ramp output register 202, and an accumulator register 204. In one embodiment, the time duration register 200 receives a clock input, a start signal input, and the time duration value from the microcontroller 102. The time duration register 200 starts in response to receiving a start pulse at the start signal input and counts the clock pulses until the preset time duration is reached. The preset time duration is set by the time duration value from the microcontroller 102. The start pulse may be generated in response to receiving the parameters from the microcontroller 102. The clock input may be a system clock that is used as an input to all of the registers in the ramp controller 108. When the time duration register 200 reaches the preset time duration, the ramp controller 108 finishes the ramp and the output of the ramp controller 108 stops incrementing or decrementing the output.

The ramp output register 202 stores a current output value at an output of the ramp controller 108. The current output value changes over time based on the desired ramp output. Whether the current output value is incremented or decremented depends on the calculation block and the clock input. The accumulator register 204 is part of a calculation block that performs calculations for the ramp step calculation algorithm, which determines the ramp output. The accumulator register 204 stores an intermediate value from the ramp step calculation algorithm.

In one embodiment, the calculation block includes a first summing circuit 206, a second summing circuit 208, a multiplexer 210, and the accumulator register 204. The first summing circuit 206 receives as inputs the end level value from the microcontroller 102 and an output of the accumulator register 204. The second summing circuit 208 receives as inputs the output of the first summing circuit 206 and the time duration value from the microcontroller 102. The output of the first summing circuit 206 and the output of the second summing circuit 208 are input into the multiplexer 210, and the output of the multiplexer 210 is input into the accumulator register 204, which stores the output of the multiplexer 210 as the intermediate value for summing with the end level value at the first summing circuit 206. A sign bit from the output of the second summing circuit 208 is used to determine which input to select at the multiplexer 210, and the sign bit may also be used to determine whether to increment the current output value stored at the ramp output register 202.

In one embodiment, the calculation block performs a calculation cycle each clock cycle. A calculation cycle may include performing each of the summing operations at the first summing block and the second summing block, and storing the selected signal from the multiplexer 210 in the accumulator register 204. Additionally, the ramp output register 202 also performs a check to determine whether to increment the current output value each clock cycle.

Figure 3:
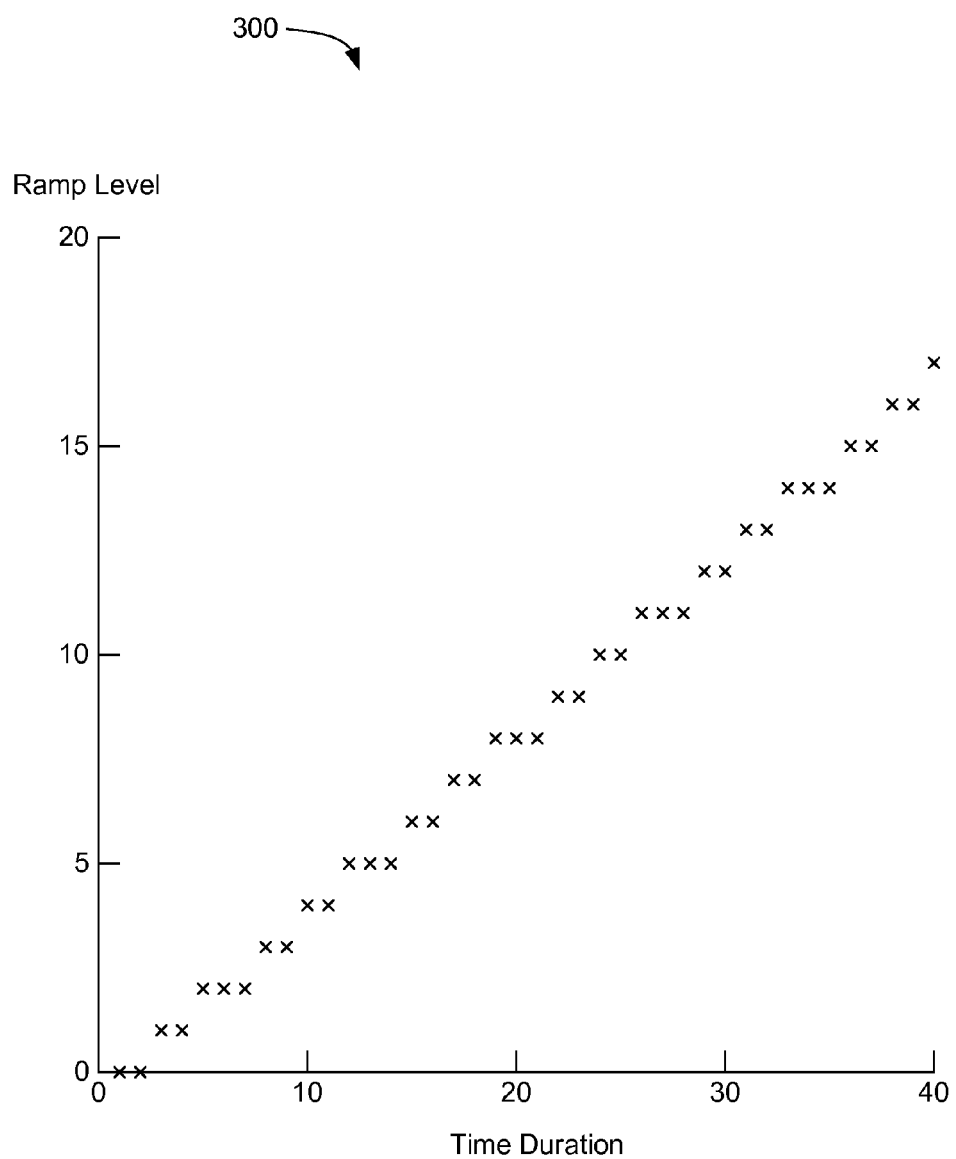
FIG. 3 depicts a graph diagram of one embodiment of a ramp output.

FIG. 3 depicts a graph diagram of one embodiment of a ramp output 300 of the ramp controller 108 of FIG. 2. While the ramp output 300 is described as having specific values in FIG. 3, and with the ramp controller 108 of FIG. 2, the ramp output 300 may have any ramp parameters and be generated using any ramp controller.

Two calculation cycles using values shown in FIG. 3 are described below:
1. The end level value is 17 and the time duration value is 40 clock cycles. Each unit of the end level value may represent 1 volt (V) or some other partial voltage value or multiple voltage value.
2. The accumulator register is initialized with an intermediate value of 0, and the ramp output register is initialized to the required initial ramp level—in this example, 0.
3. In the first calculation cycle, the first summing circuit sums the end level value with the output of the accumulator register: 17+0=17.
4. The second summing circuit subtracts the time duration value from the output of the first summing circuit: 17−40=−23.
5. The output of the first summing circuit (17) and the output of the second summing circuit (−23) are input into the multiplexer.
6. The sign bit of the output of the second summing circuit (−) is used to determine whether to increment the ramp output counter. The ramp output counter only increments when the output of the second summing circuit is positive (or non-negative). In one embodiment, the sign bit is indicated by a most significant bit (MSB) of a binary output of the second summing circuit, in which a negative sign is indicated by a 1 and a positive sign is indicated by a 0.
7. The sign bit is also used to determine which signal to select at the multiplexer. Because the sign bit is negative, the output of the first summing circuit is selected and stored as a new intermediate value (17) in the accumulator register.
8. In the second calculation cycle, the first summing circuit sums the end level value with the new intermediate value stored in the accumulator register: 17+17=34.
9. The second summing circuit subtracts the time duration value from the output of the first summing circuit: 34−40=−6.
10. Because the output of the second summing circuit is still negative, the ramp output register is not incremented, and the accumulator register stores the new output from the first summing circuit (34).

When the sum of the intermediate value stored in the accumulator register 204 and the end level value equals or exceeds the time duration value, the output of the second summing circuit 208 is zero or positive, and the current output value in the ramp output register 202 is incremented. The multiplexer 210 also selects the output of the second summing circuit 208 for storing in the accumulator register 204. The average number of cycles required to increment the current output value stored in the ramp output register 202 may be determined by dividing the time duration value by the end level value. In the example above, the average number of cycles is 40/17≈2.35, such that the current output value increments approximately every 2.35 clock cycles. As depicted, the ramp output 300 begins at 0 and ends at 17 after 40 clock cycles.

Because the average number of cycles for incrementing the current output value in the ramp output register 202 may be a non-integer, the duration of each step may not be equal. In one embodiment, the step size is predetermined and fixed based on the structure of the hardware in the ramp controller 108, such that the ramp output register 202 increments the current output value the same each time. For example, the predetermined step size may be one, as shown in FIG. 3. Other embodiments may use different hardware for performing the operations of the ramp step calculation algorithm that has another step size.

The calculation cycles may continue as described above until the number of clock cycles stored in the time duration counter equal the time duration value. When the preset time duration is reached, the ramp output register 202 stores a current output value equal to the end level value indicated by the microcontroller 102. While the example above describes the calculation cycles using an end level value of 17 and a time duration value of 40, the parameters provided by the microcontroller 102 may be any values.

In other embodiments, the calculation block includes other hardware configured to perform different operations than those described in conjunction with FIGS. 2 and 3. For example, the calculation block may include a hardware divider. The hardware divider may use additional or different parameters than those described in conjunction with FIGS. 2 and 3.

Figure 4:
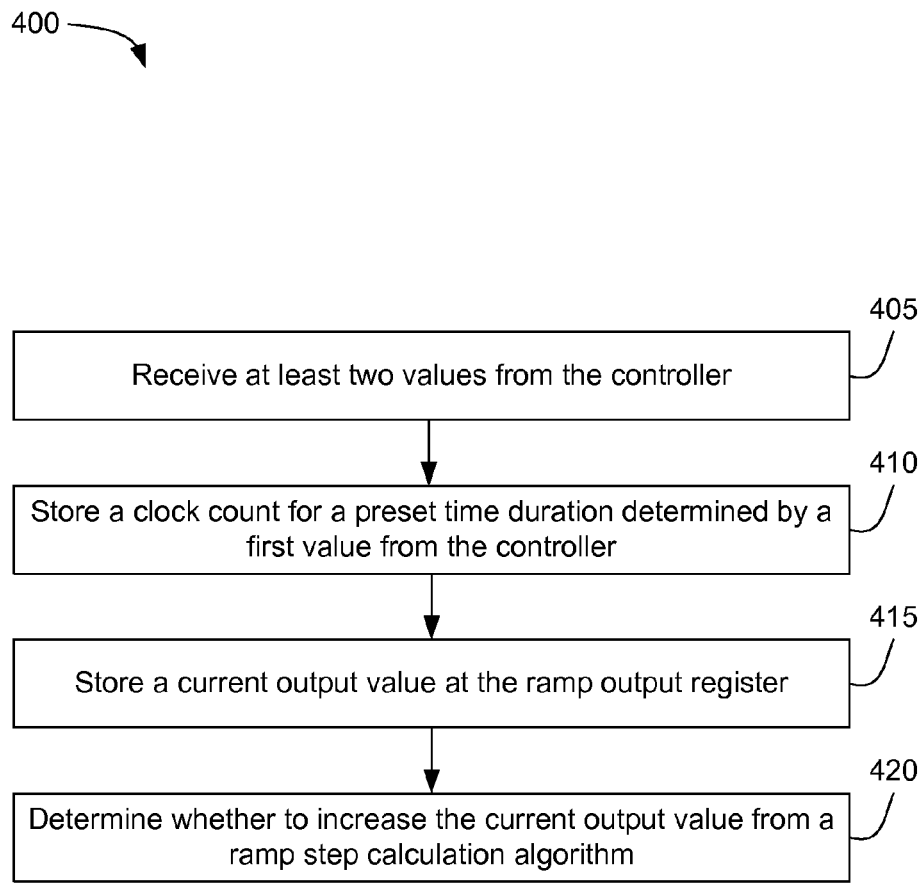
FIG. 4 depicts a flowchart diagram of one embodiment of a method of controlling a ramp output.

FIG. 4 depicts a flowchart diagram of one embodiment of a method 400 of controlling a ramp output. While the method 400 of FIG. 4 is described in conjunction with the ramp output control system 100 of FIG. 1, the method 400 may be used in conjunction with any ramp output control system 100.

In one embodiment, the ramp controller 108 or driver receives 405 at least two values or parameters from a controller or a microcontroller 102. Each of the parameters received describes a separate characteristic of the ramp output. The parameters may be programmed into the controller by a user, a manufacturer, or as a result of another process.

The ramp controller 108 stores 410 a clock count for a preset time duration which is determined by a first value from the microcontroller 102—for example, the time duration value. The ramp controller 108 stores 415 the current output value at the ramp output register 202. The ramp controller 108 also determines 420 whether to increase the current output value from the ramp step calculation algorithm based on the first and second values from the microcontroller 102. In other embodiments, the algorithm may use more than two values from the microcontroller 102. In one embodiment, the ramp controller 108 receives only two inputs, including the end level value and the time duration value. In another embodiment, the ramp controller 108 receives exactly three inputs.

In one embodiment, the algorithm may include performing successive addition and subtraction operations in hardware as the ramp progresses until the ramp output reaches the end level value provided by the microcontroller 102. The addition and subtraction operations may require only two inputs from the microcontroller 102. In another embodiment, the algorithm includes performing at least one division operation to determine one or more parameters for the ramp output. The division operation may be performed by a hardware divider included on the ramp controller 108. The hardware divider may receive different parameters than those described in conjunction with the successive addition and subtraction operations. In one embodiment, the hardware divider divides a first input from the microcontroller 102 from a second input from the microcontroller 102.

Figure 5:
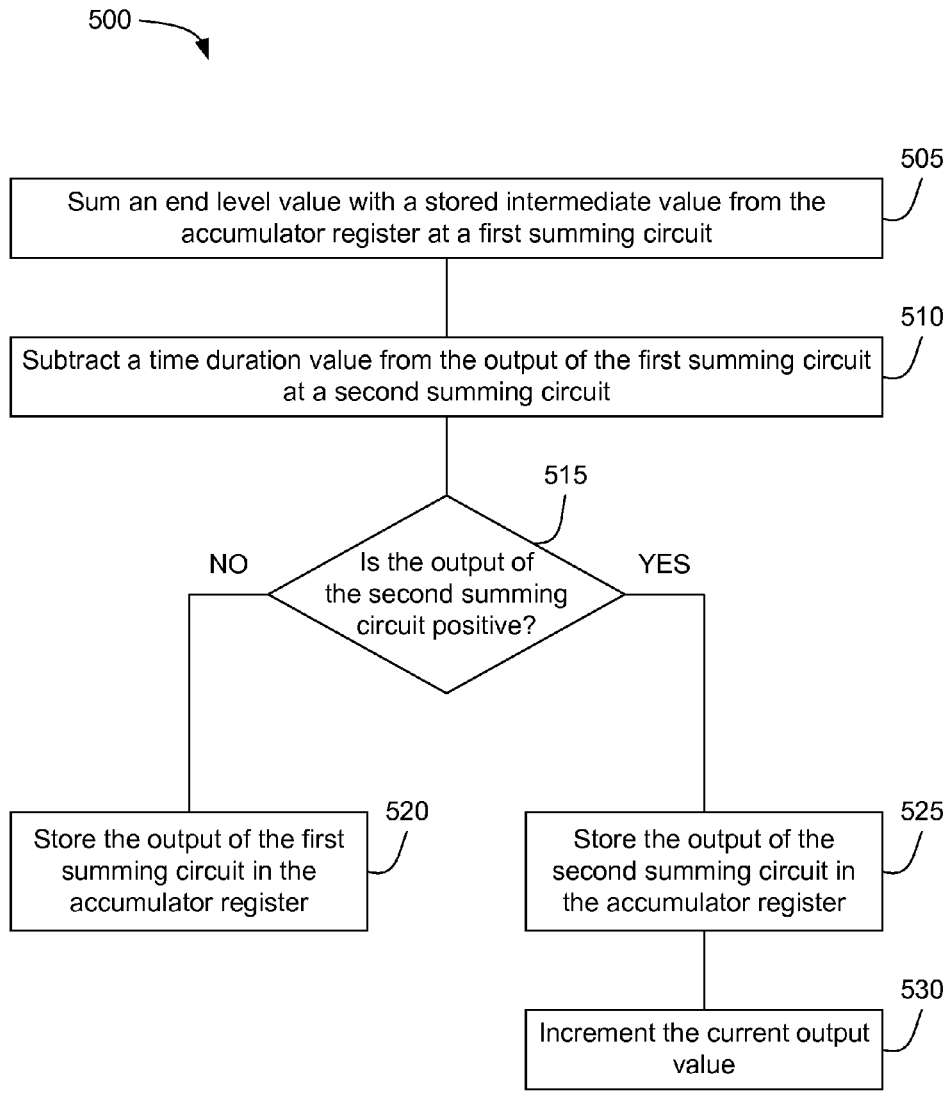
FIG. 5 depicts a flowchart diagram of one embodiment of a ramp step calculation algorithm.

FIG. 5 depicts a flowchart diagram of one embodiment of a ramp step calculation algorithm 500. While the algorithm 500 of FIG. 5 is described in conjunction with the ramp output control system 100 of FIG. 1 and the ramp controller 108 of FIG. 2, the algorithm 500 may be used in conjunction with any ramp output control system and ramp controller or other driver.

In one embodiment of the ramp step calculation algorithm 500, a first summing circuit 206 sums 505 the end level value with the output of the accumulator register 204. The accumulator register 204 is configured to store the intermediate value for the algorithm 500. The time duration value is then subtracted 510 from the output of the first summing circuit 206 at the second summing circuit 208. The summing circuits may be implemented using any hardware for adding and subtracting two different values.

After determining the sums at the first and second summing circuits 206, 208, the outputs of the summing circuits are input into the multiplexer 210. The multiplexer 210 selects one of the outputs of the summing circuits based on the sign of the output of the second summing circuit 208. In one embodiment, the output of the second summing circuit 208 is a binary number, with the MSB representing the sign of the number. The sign of the output of the second summing circuit 208 may be determined by the multiplexer 210 or another component in the ramp controller 108. The algorithm checks 515 if the output of the second summing circuit 208 is positive or negative. If the output of the second summing circuit 208 is negative (represented by a bit value of 1), the multiplexer 210 selects the output of the first summing circuit 206, and the output of the first summing circuit 206 is stored 520 in the accumulator register 204 as the new intermediate value.

If the output of the second summing circuit 208 is positive (represented by a bit value of 0), the multiplexer 210 selects the output of the second summing circuit 208, and the output of the second summing circuit 208 is stored 525 in the accumulator register 204 as the new intermediate value. Additionally, if the sign is positive, the ramp output register 202 increments 530 the current output value. Thus, the ramp output register 202 only increments the current output value when the sum of the end level value and the intermediate value of the accumulator register 204 is equal to or greater than the time duration value. In one embodiment, the ramp output register 202 increments the current output value with a fixed step size. The step size may be one, for example. In other embodiments, the step size may be different, though modifications to the hardware in the ramp controller 108 may be required.

In one embodiment, the contents of the accumulator register 204 at any time may be represented as follows:

$$A(t)=tY-Tn,$$

where A represents the accumulator register 204, t represents the number of clock cycles since the start of the current calculation, Y is the end level value, T is the time duration value, and n is the number of increment pulses that have occurred up to time t. The above formula reflects the fact that up to time t there were t operations, each increasing the intermediate value in the accumulator register 204 by Y, and n subtraction operations, each decreasing its value by T. When t reaches T (the stop condition), the formula becomes $$A(T)=TY-Tn.$$

Because of the way the circuit operates, A is limited by the following:

$$0 \leq A(t) < T.$$

Thus, Y and n in the previous formula are related as $$0 < Y-n < 1.$$

Because both Y and n are integers, it follows that n=Y. Other embodiments may use increment steps other than one, to start the ramp from a non-zero value or to reverse the ramp direction for decrementing the start value at the expense of additional circuit components. The linear ramp output may also be applied to a lookup table or a functional block to produce a curved ramp that is not linear, for example, an exponent or a gamma-corrected curve.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A ramp output control device, comprising:
a driver configured to receive at least two inputs from a microcontroller, wherein the driver comprises:
   a time duration register configured to store a current clock count until a preset time duration is reached;
   a ramp output register configured to store a current output value at an output of the device; and
   a calculation block configured to determine whether to increase the current output value at the output based on the at least two inputs, wherein the calculation block comprises:
      an accumulator register configured to store an intermediate value for a ramp step calculation algorithm for determining the current output value;
      a first summing circuit configured to sum a first input from the microcontroller with an output of the accumulator register;
      a second summing circuit configured to subtract a second input from the microcontroller from an output of the first summing circuit; and
      a multiplexer configured to select one of the output of the first summing circuit and an output of the second summing circuit based on a sign of the output of the second summing circuit, wherein an output of the multiplexer is stored in the accumulator register.

2. The device of claim 1, wherein the multiplexer is configured to:
   select the output of the first summing circuit in response to determining that the sign of the output of the second summing circuit is negative.

3. The device of claim 1, wherein the current output value stored in the ramp output register is incremented in response to determining that the output of the second summing circuit is positive.

4. The device of claim 1, wherein the driver receives only two inputs from the microcontroller, wherein a first input comprises an end level value for the output and a second input comprises a time duration value for the output.

5. The device of claim 1, wherein the driver receives only three inputs from the microcontroller.

6. The device of claim 1, wherein the calculation block comprises hardware logic for dividing a first input from the microcontroller by a second input from the microcontroller.

7. The device of claim 1, wherein the ramp output register increments the current output value with a fixed step size.

8. The device of claim 1, wherein the multiplexer is configured to select the output of the second summing circuit in response to determining that the sign of the output of the second summing circuit is positive.

9. A system, comprising:
   a controller configured to output at least two values;
   a ramp driver, comprising:
      a time duration register configured to store a clock count for a preset time duration, wherein the preset time duration is determined by a first value from the controller; and
      a ramp output register configured to store an output value at an output of the ramp driver; and
      a calculation block configured to determine whether to increase the output value at the output based on the first value and a second value from the controller, wherein the calculation block comprises:
         an accumulator register configured to store an intermediate value for a ramp step calculation algorithm for determining the current output value;
         a first summing circuit configured to sum the second value with an output of the accumulator register;
         a second summing circuit configured to subtract the first input from an output of the first summing circuit; and
         a multiplexer configured to select one of the output of the first summing circuit and an output of the second summing circuit based on a sign of the output of the second summing circuit, wherein an output of the multiplexer is stored in the accumulator register.

10. The system of claim 9, wherein the multiplexer is configured to:
    select the output of the first summing circuit in response to determining that the sign of the output of the second summing circuit is negative.

11. The system of claim 9, wherein the output value stored in the ramp output register is incremented in response to determining that the output of the second summing circuit is positive.

12. The system of claim 9, wherein the controller outputs only two values to the driver, wherein the first value comprises a time duration value for the output and the second input comprises an end level value for the output.

13. The system of claim 9, wherein the controller outputs only three values to the driver.

14. The system of claim 9, wherein the calculation block comprises hardware logic for dividing a first input from the microcontroller by a second input from the microcontroller.

15. The system of claim 9, wherein the multiplexer is configured to select the output of the second summing circuit in response to determining that the sign of the output of the second summing circuit is positive.

16. A method for controlling a ramp output, the method comprising:
    receiving at least two values from a controller, wherein each of the at least two values describes a separate characteristic of the ramp output;
    storing a clock count for a preset time duration, wherein the preset time duration is determined by a first value from the controller;
    storing a current output value at a ramp output register;
    determining whether to increase the current output value from a ramp step calculation algorithm based on the first value and a second value from the controller;
    summing, at a first summing circuit, the second value with an output of an accumulator register, wherein the accumulator register is configured to store an intermediate value for the ramp step calculation algorithm;
    subtracting, at a second summing circuit, the first input from an output of the first summing circuit; and
    selecting one of the output of the first summing circuit and an output of the second summing circuit based on a sign of the output of the second summing circuit; and
    storing the selected output in the accumulator register as a new intermediate value.

17. The method of claim 16, further comprising incrementing the current output value in response to determining that the output of the second summing circuit is positive.

* * * * *